United States Patent [19]

Takai et al.

[11] 4,432,068

[45] Feb. 14, 1984

[54] METHOD OF CONTROLLING A BUBBLE MEMORY DEVICE

[75] Inventors: Sakan Takai; Toshiaki Sukeda, both of Suzaka, Japan

[73] Assignee: Fujitsu Limited, Kawasaki, Japan

[21] Appl. No.: 298,620

[22] Filed: Sep. 2, 1981

[30] Foreign Application Priority Data

Feb. 3, 1981 [JP] Japan .................................. 56-14756

[51] Int. Cl.³ ........................................... G11C 19/08
[52] U.S. Cl. ......................................... 365/6; 365/1
[58] Field of Search ............................. 365/1, 6, 213

[56] References Cited

FOREIGN PATENT DOCUMENTS 54-59039  4/1979  Japan ...................................... 365/1
55-163681 9/1980  Japan ...................................... 365/1

OTHER PUBLICATIONS

Electronics, vol. 54, No. 9, May 5, 1981, pp. 149–151.

*Primary Examiner*—James W. Moffitt
*Attorney, Agent, or Firm*—Staas & Halsey

[57] ABSTRACT

A method of controlling a magnetic bubble memory device comprising a rotating field generation coil for applying the rotating field to a magnetic pattern formed on a magnetic bubble memory chip and transferring the magnetic bubble along the magnetic pattern. A bubble memory device controlled by the method of the present invention, is capable of operating in a wider ambient temperature range by heating the chip through heat generation realized by applying a heating current to the rotating field generation coil while the magnetic bubble transfer control is not carried out.

11 Claims, 19 Drawing Figures

METHOD OF CONTROLLING A BUBBLE MEMORY DEVICE

BACKGROUND OF THE INVENTION

This invention relates to a method of controlling a magnetic bubble memory device which operates over a wide range of temperature.

When an adequate bias field is applied vertically to a magnetic thin plate surface such as garnet or orthoferrite having uniaxial magnetic anisotropy, a cylindrical magnetic domain, the so-called magnetic bubble is generated.

Magnetic bubble devices which perform accumulation of information and logical operation by using such magnetic bubbles, are now under development for practical use in the field because such devices are nonvolatile, fully solid state, suitable for large capacity and operate at a comparatively high speed.

For magnetic bubble devices, various functions such as generation, transfer, division, expansion, detection and erasure of magnetic bubbles are required. Moreover, required are bias field application means for stably maintaining the magnetic bubbles in the magnetic thin plate and rotating field application means for moving magnetic bubbles within the magnetic thin plate based on the magnetic pattern formed on the magnetic thin plate.

FIG. 1 shows a typical structural example of a magnetic bubble memory chip used for as a magnetic bubble device. The structure shown in this figure is a so-called major/minor loop. In this figure, 1 is the major loop; 2 is the minor loop; 3 is the detector; 4 is the generator; 5 is the replicator; 6 is annihilator; and 7 is the transfer gate. The solid line indicates the magnetic bubble transfer route by the permalloy pattern formed on the magnetic bubble thin plate, while the broken line indicates the conductor pattern consisting of the gold, etc., formed on the thin plate in the same way. The operation of this device is explained below.

A current is applied to the loop conductor pattern forming the generator 4 in such a direction so as to effectively reduce the bias field and, in accordance with the data to be written, in order to generate the magnetic bubble within the loop. The magnetic bubble generated is transferred in the major loop 1 by the drive field which rotates within the surface direction of magnetic thin film and thereby the bubble containing one data segment (as large as one word, for example) is arranged at the corresponding position of each minor loop 2. At this time, a current is applied to the conductor pattern forming the transfer gate 7 and the magnetic bubble data segment on the major loop 1 is sent to the minor loop 2. The magnetic bubble transferred to the minor loops 2 circulates in the minor loops 2 by means of the drive field, thus storing data.

The stored data can be read as follows. Namely, when the desired magnetic bubble data segment stored in the minor loop 2 comes to the position corresponding to the transfer gate 7, a current is applied to the conductor pattern and thereby the magnetic bubble data segment is transferred to the major loop 1. The magnetic bubble data segment transferred to the major loop is sequentially transferred to the replicator 5 by means of the drive field. The replicator 5 divides the sequentially arriving magnetic bubbles into two parts and transfers one to the detector 3 along the permalloy pattern, and the other to the minor loop via the major loop 1. The detector 3 expands the sequentially appearing magnetic bubbles in order to raise the detection efficiency and also detects changes in electrical resistance of the magnetic resistance element induced by the arriving magnetic bubbles, as changes in voltage. In case it is required to erase the data after reading it and to write new data, it is necessary after dividing the magnetic bubble, to have the annihilator 6 erase the magnetic bubble on the major loop and then send another new data by means of generator 4.

FIG. 2 shows the structure of a package accommodating the magnetic bubble chip shown in FIG. 1. In this figure, 8 is the magnetic bubble chip; 9 is the chip mounting plane; 10 is the XY coil for drive field generation; 11 is the ferrite yoke; 12 is the thin plate magnet for applying bias field; and 13 is the shield case. The triangular currents having a phase difference of 90° as shown in FIG. 3 (a) are applied to each coil of the XY coil to generate the drive field and the square locus of the rotating field as shown in FIG. 3 (b). Such a drive method using the triangular waves has various merits as compared with the drive method using the sine wave. Namely, the circuit structure is simplified, fewer parts are used, a high drive voltage is not required, and integration can be realized easily.

The storing operation of the magnetic bubble memory explained above is stable within the operating temperature range specified by the temperature characteristic of magnetic domain crystal in the magnetic thin film, but such range can be as narrow as 0° C. to +55° C. However, it is required to widen the temperature range up to −20° C. to +55° C. To achieve this range, the devices which satisfy the temperature range are selected from many devices.

Therefore, the step of selection is necessary in order to obtain the devices having the wider temperature range, thus degrading the yield.

SUMMARY OF THE INVENTION

It is an object of the present invention to provide an improved bubble memory device assuring a wider operating temperature range.

It is another object of the present invention to provide a small size magnetic bubble memory device where the rotating field generation coil also works as a heating means.

The present invention discloses a method of driving a magnetic bubble memory device comprising the rotating field generation coil for applying the rotating field to the magnetic pattern formed on the magnetic bubble memory chip and transferring the magnetic bubble along the magnetic pattern, wherein the operation within the wider temperature range is assured in such a way that the chip is heated by applying a heating current to the rotating field generation coil during the period when the magnetic bubble transfer control is not carried out.

The present invention is characterized in that the rotating field generation coil is also used as the heating means by applying thereto a heating current during the period that the coil is not used for the fundamental operation, namely when no access is made to the magnetic bubbles. The magnetic bubbles are transferred along the magnetic pattern magnetized by the rotating field, but when the rotating field disappears, the hold field having a constant direction is applied to this magnetic pattern in order to hold the magnetic bubbles at a constant location of the magnetic pattern.

This hold field can be generated by various methods. Typically, as shown in FIG. 4, a part of the bias field is used as the hold field. Here, the magnetic bubble chip 8 is placed at an angle of $\theta$ with respect to the field $H_o$ of the bias field application magnets 12, 12'. In such arrangement, the bias field $H_B$ and horizontal field $H_h$ are generated on the bubble chip as shown in FIG. 5. At this time, only the horizontal field $H_h$ is used as the hold magnetic field. In the present invention, a heating current is applied to the rotating field generation coil when the access is not made to the magnetic bubbles and naturally the direction of field generated by the heating current flowing into the coil at this time must coincide with the direction of hold magnetic field. Therefore, the explanation will be made only for the case where a heating current is applied only to the Y coil.

FIG. 6 shows the equivalent circuit of the Y coil. $L_Y$ is the coil inductance, and $R_Y$ is DC resistance of the coil.

When a current $I_Y$ flows into the coil, the power (P) consumed by the coil is expressed as. $P = I_Y^2 R_Y$. When a temperature rise of device per power consumption (W) is considered as T° C./W, the current $I_Y$ required to raise the temperature t° C. is expressed as follows.

$$I_Y = \sqrt{t/(T \cdot R_Y)} \quad (A)$$

FIG. 7 shows the drive current margins of X and Y coils. In the ordinary operation, a current within the range indicated by hatched area is used. The allowable current $I_{Y\,max}$ in the hold direction which can be applied to the Y coil is determined by the maximum intensity of field in the hold direction which can stably hold the bubble in the magnetic pattern. Such a value varies among devices and generally is within the range from $1.2 \times I_{Y2}$ to $2.0 \times I_{Y2}$.

DESCRIPTION OF THE PREFERRED EMBODIMENT

Figure 1:
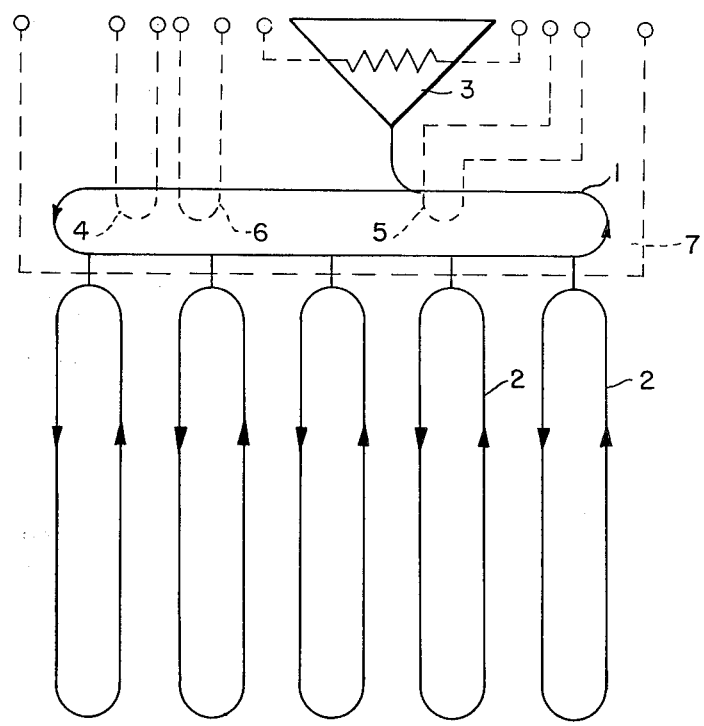
FIG. 1 shows a typical magnetic bubble memory chip structure.
Figure 2:
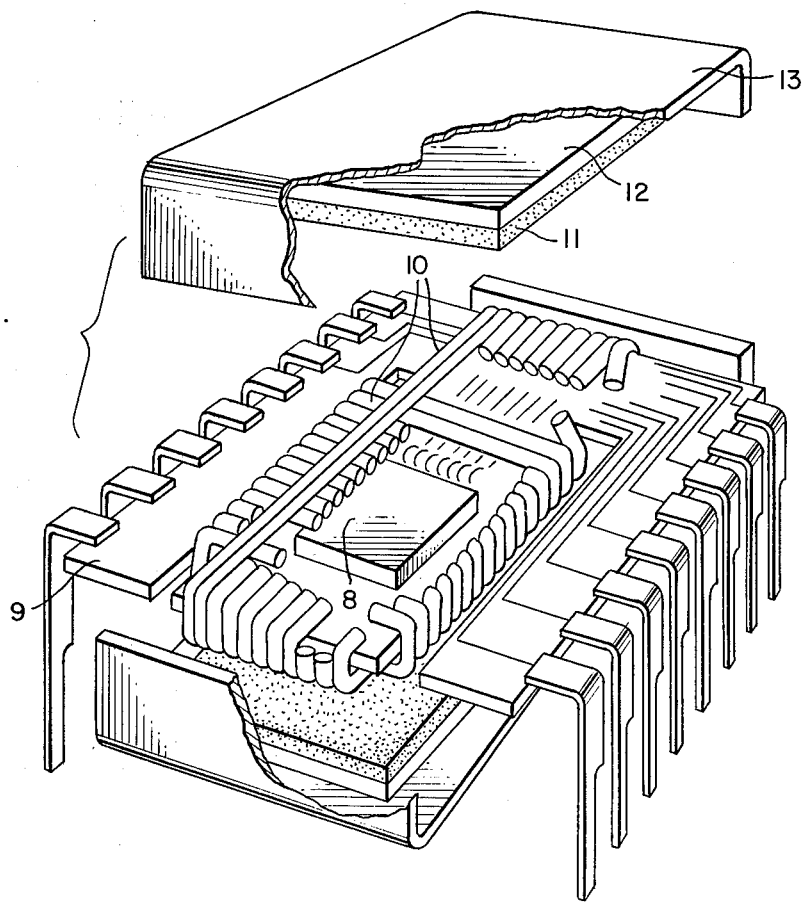
FIG. 2 shows the magnetic bubble memory package structure for the FIG. 1 chip.
Figure 3A:
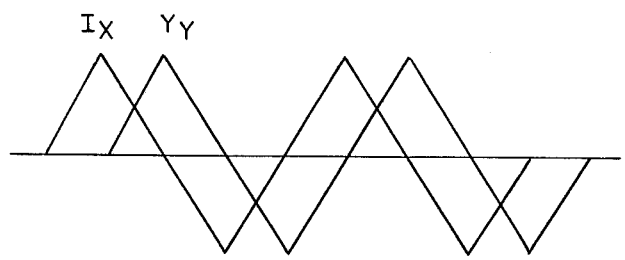
FIG. 3 shows the rotation field generation coil drive signal waveform.
Figure 3B:
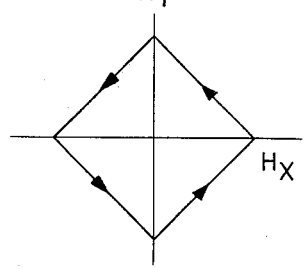
Figure 4:
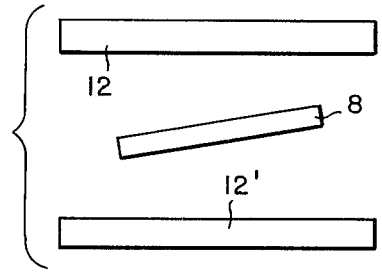
FIG. 4 and FIG. 5 illustrate the principle of the hold magnetic field.
Figure 5:
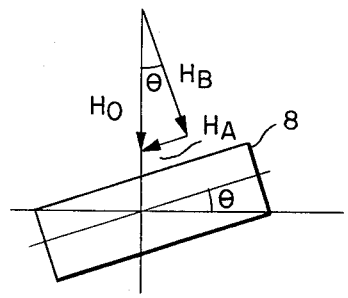
Figure 6:
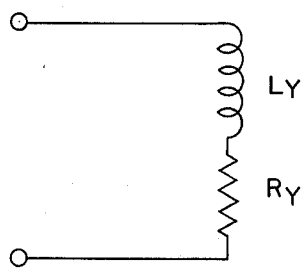
FIG. 6 depicts the equivalent circuit of a rotating field generation Y coil.
Figure 7:
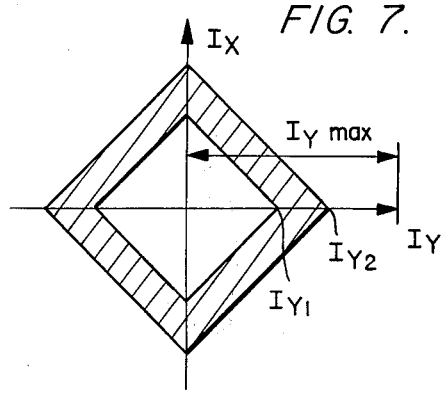
FIG. 7 shows the drive current margin for the X and Y rotating field generation coils.
Figure 8:
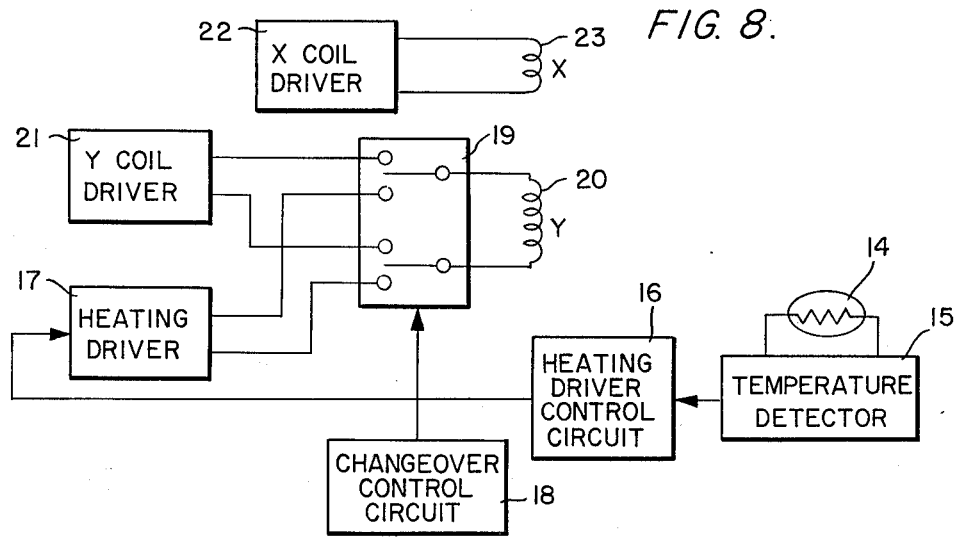
FIG. 8 is a block diagram of a rotation field generation coil drive circuit of the magnetic bubble memory device according to the first embodiment of the present invention.

FIG. 8 is the block diagram of the rotating field generation coil drive circuit of the magnetic bubble memory device of a first embodiment of the present invention. The circuit operation will be explained below.

An output of a temperature detecting element 14, such as a thermistor, is converted into a temperature detection signal by a temperature detector 15 and then transmitted to a heating driver control circuit 16. The heating driver control circuit 16 changes the condition of driving a heating driver 17 depending on the temperature detection signal. A change-over control circuit 18 controls a switch circuit 19 which connects a Y coil 20 and Y coil driver 21 during the magnetic bubble access period, or connects the Y coil 20 and heating driver 17 for heating during another period.

Figure 9:
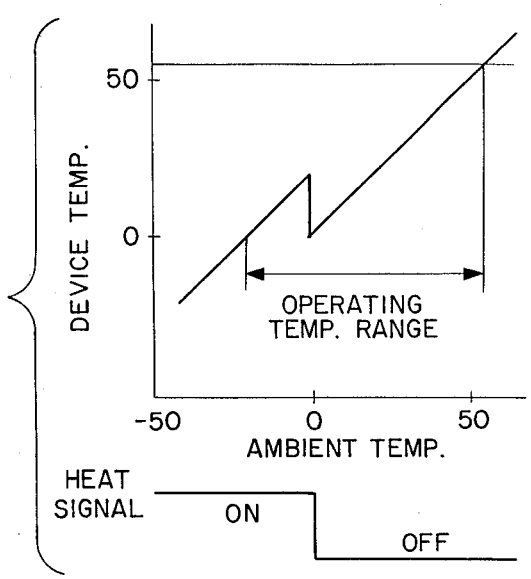
FIG. 9, FIG. 10 and FIG. 11 graphically illustrate the widening of the operating temperature range produced by the present invention.
Figure 10:
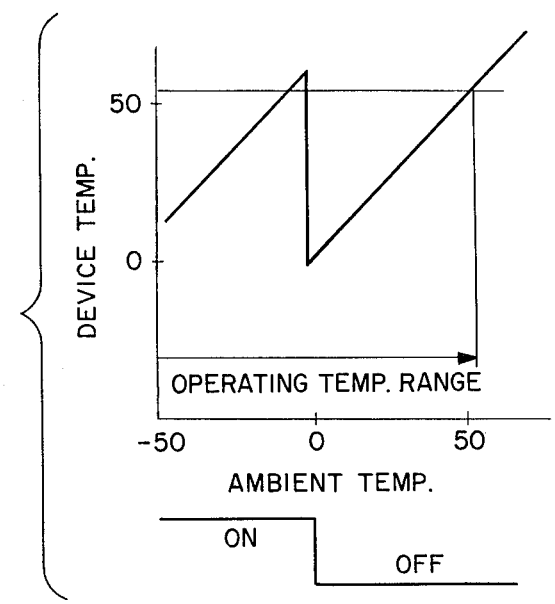

FIG. 9 and FIG. 10 show the graphs explaining that the operating range of magnetic bubble memory device is widened by providing the heating means.

In any case, the heating driver is operated when the ambient temperature is 0° C. or less. In FIG. 9, a heating current is applied so that the maximum device temperature increase is limited to about 20° C. and the device can be used in the ambient temperature range of from $-20°$ C. to $+55°$ C. when the operating temperature range of the device is selected to be 0° C. to $+55°$ C.

In FIG. 10, a higher heating current is used. In this case, the operating range of the magnetic bubble device is extended to a lower ambient temperature, but a device temperature may exceed $+55°$ C. at the ambient temperature of 0° C. This device temperature will adversely effect the device, thus jeopardizing normal operation and increasing power loss. Therefore, such a high device temperature should be avoided.

Figure 11:
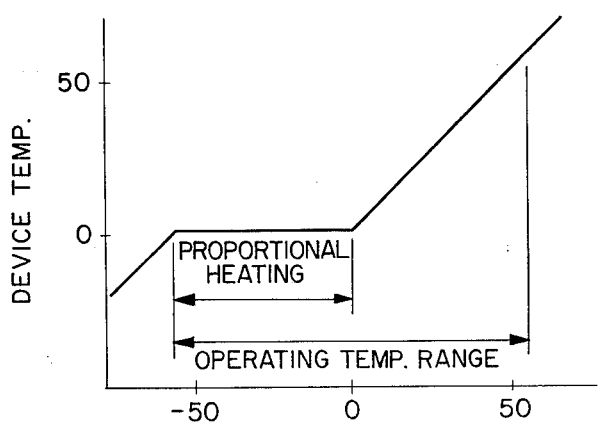

For this purpose, the example shown in FIG. 11 using proportional heating is effective. In this example, the heating condition is changed at a temperature near to 0° C. and at a temperature far from 0° C., but below 0° C.

Practically, a high heating current is used, for example, at the ambient temperature of about $-50°$ C., and it is gradually decreased as the ambient temperature approaches 0° C. this is accomplished by varying the drive pulse width.

Figure 12:
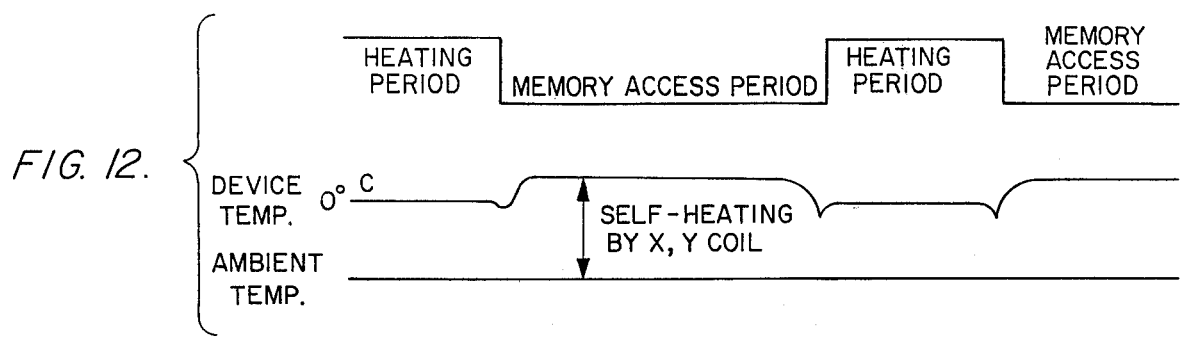
FIG. 12 graphically illustrates the temperature changes of a device used in the magnetic bubble memory device of the present invention.

FIG. 12 shows an example of the device temperature change during the bubble memory access period and the heating period for a magnetic bubble device controlled according to the present invention. Even in case the ambient temperature is low, a coil generates heat in the heating period. Therefore, the device is preheated and assures normal operation during the bubble memory access period.

In the bubble memory access period, the device temperature increases due to self-heating caused by current flowing into both X and Y coils.

Figure 13:
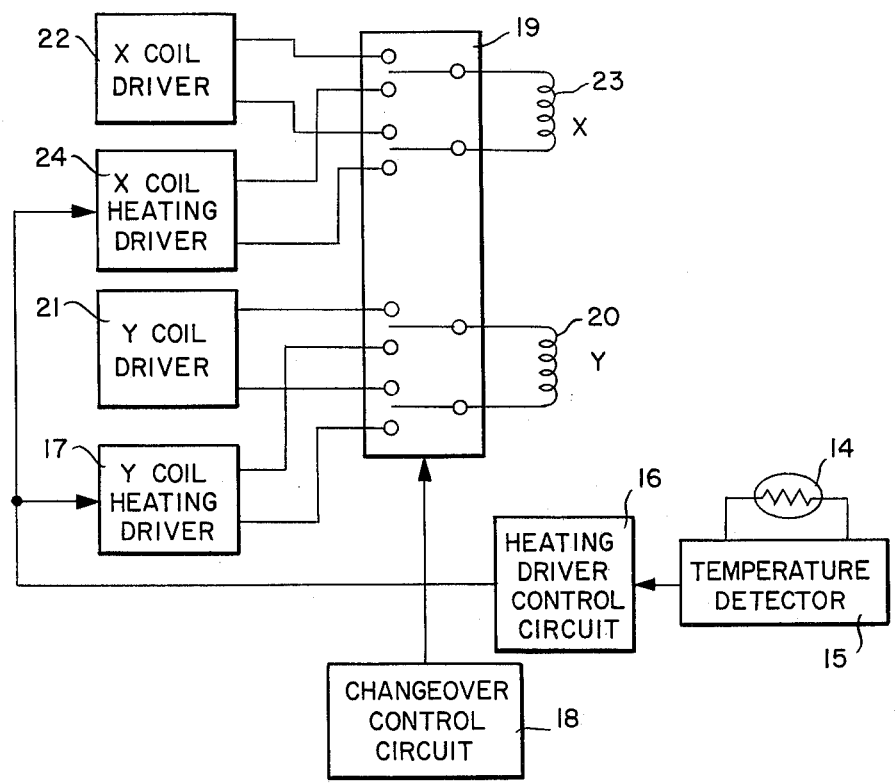
FIG. 13 is a block diagram of the rotating field generation coil drive circuit of the magnetic bubble memory device according to the second embodiment of the present invention.

FIG. 13 is a block diagram of the rotating field generation coil drive circuit of the magnetic bubble memory device of a second embodiment of the present invention.

In the first embodiment explained above, only the Y coil 20 is used for heating in the coil drive circuit block diagram because the direction of the magnetic field generated by the Y coil 20 matches the desired holding field direction. However, it is sometimes impossible to allow a high level current to flow into the Y coil 20 because of the device characteristic. In such a case, the X coil 23 is also used for heating because the heating power obtained only by the Y coil 20 is insufficient. In this case, the Y coil 20 and Y coil heating driver 17 are connected by the changeover control circuit 18 during the heating period, while the X coil 23 and X coil heating driver 24 are also simultaneously connected by the switch circuit 19.

Figure 14:
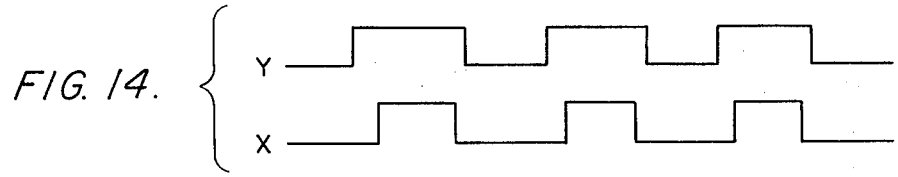
FIG. 14 shows the timing of the heating signal shown in FIG. 13.

In this case, the drive signal applied to the X coil 23 and Y coil 20 has the timing as shown in FIG. 14.

Namely, a signal is applied to the Y coil 20 and then a signal is also applied to the X coil 23, and after the signal applied to the X coil 23 is disconnected, the signal applied to the Y coil 20 is disconnected.

The resulting holding field is oriented to the center (direction of 45°) between the X and Y field directions, while the signals of X coil 23 and Y coil 20 overlap, thus the bubbles do not move from the stationary condition.

The circuit operation of the Y coil drive circuit shown in FIG. 8 will now be explained in more detail.

Figure 15:
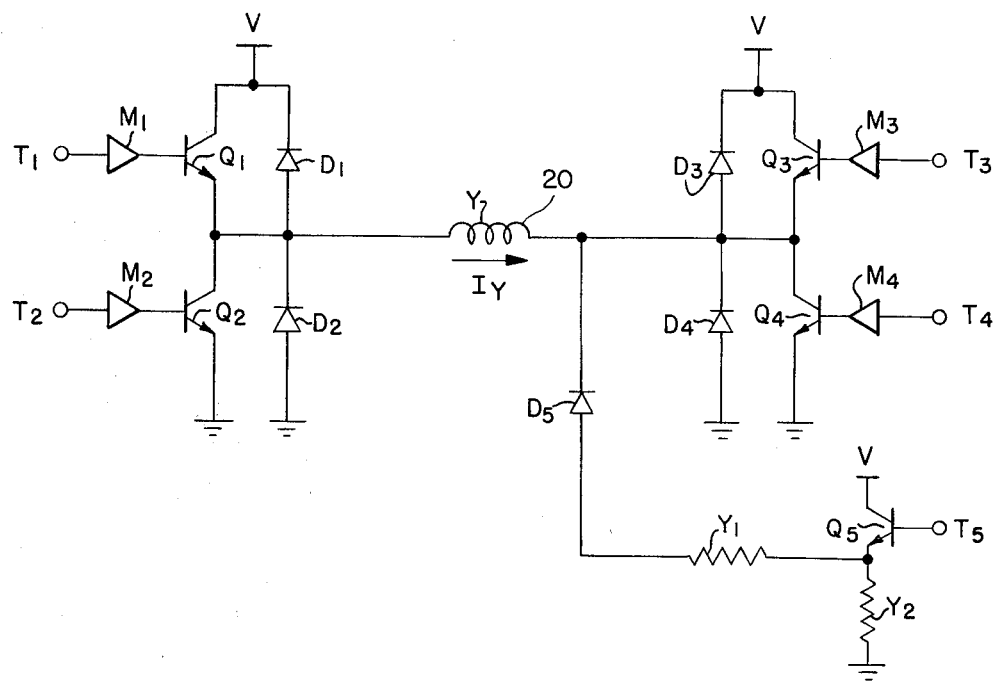
FIG. 15 shows the triangular wave drive circuit for the rotating field generation Y coil of the first embodiment of the present invention.
Figure 16:
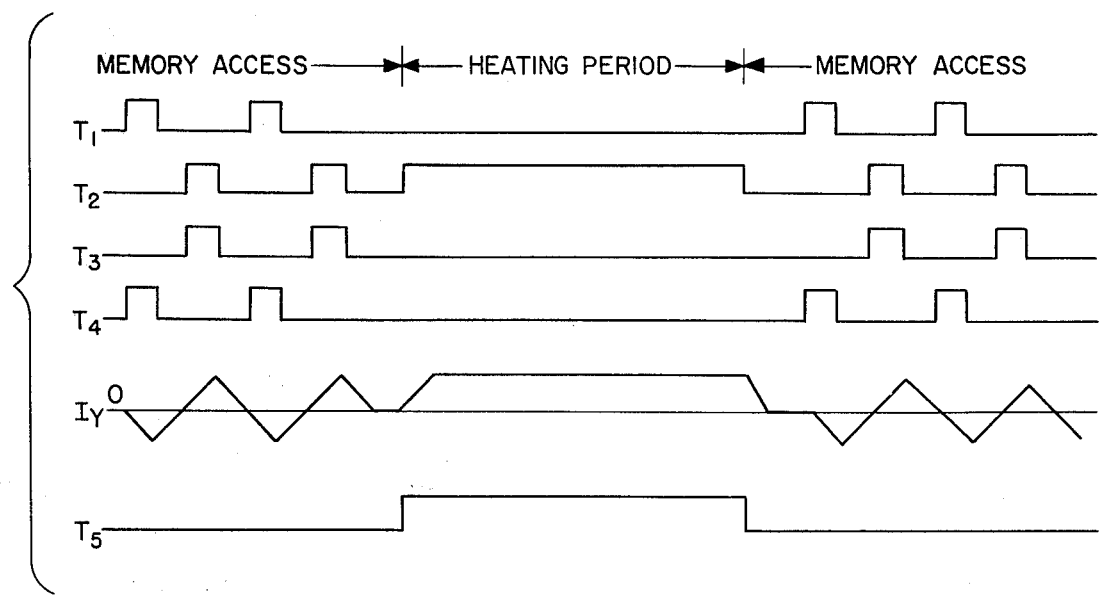
FIG. 16 shows the operational timing of the FIG. 15 circuit.

FIG. 15 shows the triangular wave drive circuit of the rotating field generation Y coil of the first embodiment of the present invention. FIG. 16 shows the operational timing for the circuit of FIG. 15. The circuit operation will be explained.

During the bubble memory access period, an ordinary triangular wave current flows into the Y coil 20. When the timing signal T1 is applied, this signal turns ON the transistor Q1 via the level conversion circuit M1. Simultaneously, the timing signal T4 is applied, and this signal turns ON the transistor Q4 via the level conversion circuit M4. Therefore, the power supply V is applied during the period of timing signals T1 and T4 to the Y coil 20. Thereby a current $I_Y$ flows in the direction indicated by the arrow. When the timing signals T1 and T4 disappear, a reverse current flows into the Y coil 20 via the diodes D1 and D2.

Then, the timing signal T2 turns ON the transistor Q2 via the level conversion circuit M2 and simultaneously the timing signal T3 turns ON the transistor Q3 via the level conversion circuit M3. Thereby, a current flows into the Y coil 20 in the direction opposing that indicated by the arrow mark. In the same way, a triangular current flows into the Y coil while the timing signals T1, T4, and timing signals T2, T3 are applied alternately.

The above operations are performed during the ordinary bubble memory access period, but when the heating period starts, the continuous signals are applied to the transistors Q5 and Q2. Resultingly, during this period, the transistors Q2 and Q5 turn ON and the power source V is applied to the Y coil 20, and a current specified by the resistor Y1 and Y coil resistance $R_Y$ flows, causing generation of heat.

Figure 17:
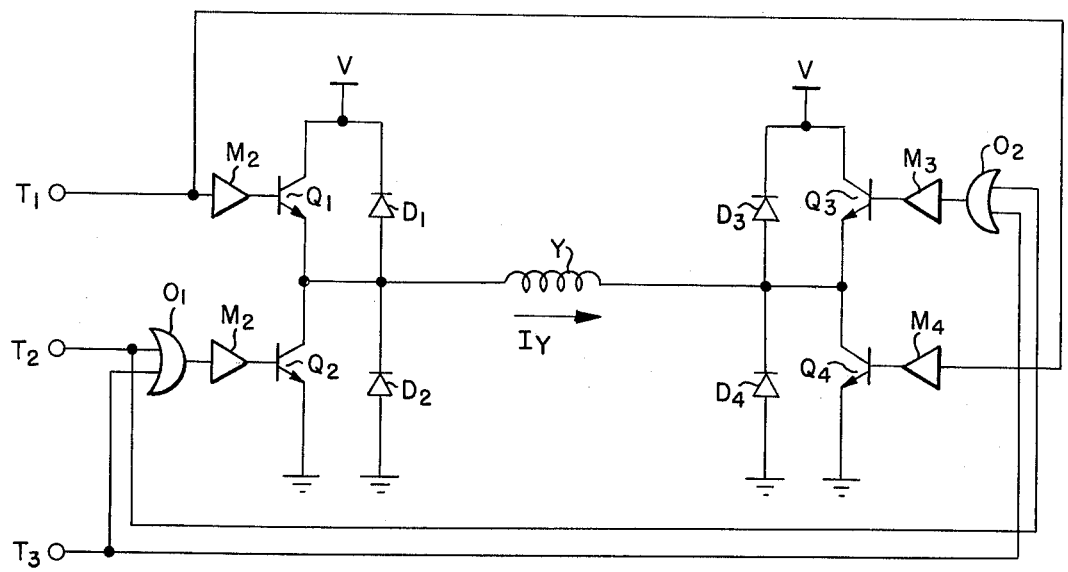
FIG. 17 shows the triangular wave drive circuit for the rotating field generation Y coil of the second embodiment of the present invention.
Figure 18:
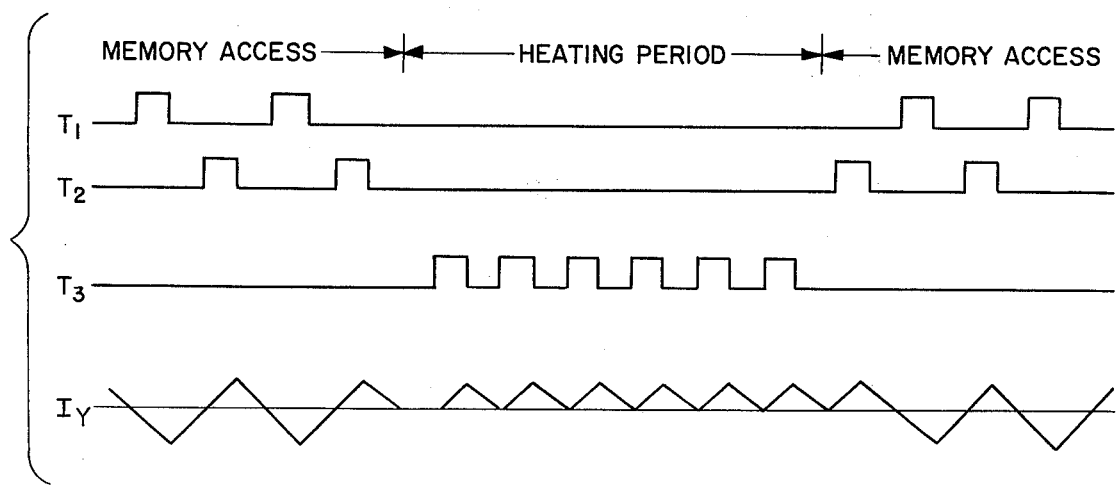
FIG. 18 shows the operational timing chart in relation of the FIG. 17 circuit.

FIG. 17 shows the Y coil triangular wave drive circuit for the Y coil of the second embodiment of the present invention. FIG. 18 shows the operational timing chart for the circuit of FIG. 17.

In the circuit of FIG. 17, control is further simplified as compared with the circuit of FIG. 15. Namely, when the timing signal T1 is applied during the bubble memory access period, this signal is applied to the transistors Q1 and Q4 via the level conversion circuits M1,M4 turning ON both transistors simultaneously. Resultingly, a current $I_Y$ flows in the direction indicated by the arrow mark into the Y coil 20. When the timing signal T2 is applied, this signal turns ON the transistor Q2 via the OR circuit O1 and level conversion circuit M2. Simultaneously, this signal turns ON the transistor Q3 via the OR circuit O2 and the level conversion circuit M3. Therefore, a reverse current flows in the Y coil. A triangular wave current flows by repeating such operation.

The above operations are performed during the bubble access period, and when the heating period starts, only the timing signal T3 is applied.

While the timing signal T3 is ON, the transistors Q2 and Q3 are ON and a current flows into the Y coil 20. But since the period of timing signal T3 is shorter than that of the timing signal T1 or T2, the heat is gradually generated. Heat radiation of the Y coil 20 controlled in this manner, is controlled by adjusting the period or pulse width of the timing signal T3.

As explained previously, the present invention offers notable effect of improving drastically the operating temperature range of the magnetic bubble memory device without adding any heating means through the skillful method that a heating current is applied to the rotating field generation coil during the period where no access is performed to the magnetic bubble memory.

We claim:

1. A method of driving a magnetic bubble memory device having a rotating field generation coil which applies a rotating field to a magnetic pattern formed on a magnetic bubble memory chip and transfers the magnetic bubbles along the magnetic pattern, comprising the step of:
   (a) heating the magnetic bubble memory chip by applying a heating current to the rotating field generation coil in such a period that the magnetic bubbles are not being transfered.

2. A method of driving a magnetic bubble memory device according to the claim 1, wherein the device has a holding field direction and step (a) further includes applying the heating current to the rotating field generation coil while simultaneously generating a holding field matching the hold field direction of the device.

3. A method of driving a magnetic bubble memory device according to the claim 1, wherein the device further comprises another rotating field generation coil and has a holding field direction, and step (a) further includes applying the heating current to the rotating field generation coil while simultaneously generating a holding field matching the holding field direction of device and simultaneously applying the heating current to the another rotating field generation coil.

4. A method of driving a magnetic bubble memory device according to claim 3, wherein the device further comprises a drive circuit operatively connected to the another rotating field generation coil and switching means for selectively connecting the another rotating field generation coil to one of the heating current and the drive circuit, and the method further includes connecting the another rotating field generation coil and the drive circuit during the transferring of the magnetic bubbles along the magnetic pattern, and disconnecting the another rotating field generation coil and drive circuit while simultaneously applying the heating current to the another rotating field generation coil during the period that the magnetic bubbles are not being transferred.

5. A method of driving a magnetic bubble memory device according to claim 2, wherein the device further comprises a drive circuit operatively connected to the rotating field generation coil and switching means for selectively connecting the rotating field generation coil to one of the heating current and the drive circuit, and the method further includes connecting the rotating field generation coil and the drive circuit during the transferring of the magnetic bubbles along the magnetic pattern, and disconnecting the rotating field generation coil and the drive circuit while simultaneously applying the heating current to the rotating field generation coil during the period that the magnetic bubbles are not being transferred.

6. A method of driving a magnetic bubble memory device according to the claim 5 or 4, wherein the device further comprises a temperature detection element, a temperature detection circuit and heating driver means for providing the heating current, and the method further includes controlling the operating condition of the heating driver means in dependence on an output from said temperature detection circuit.

7. A method of driving a magnetic bubble memory device according to claim 6, wherein the device has a specified lowest operating temperature and the method further includes applying the heating current in proportion to a difference between the temperature detected by the temperature detection circuit and the lowest operating temperature specified for the device.

8. A method of driving a magnetic bubble memory device according to claim 7, wherein the output of the temperature detection circuit has a variable drive pulse period, and the method further includes varying the variable drive pulse width in accordance with the detected temperature, and applying the heating current in accordance with the variable drive pulse width.

9. A method of driving a magnetic bubble memory device according to claim 7, wherein the output of the temperature detection circuit has a variable drive pulse period, and the method further includes varying the variable drive pulse period in accordance with the detected temperature, and applying the heating current in accordance with the variable drive pulse period.

10. A method of driving a magnetic bubble memory device according to claim 7, wherein the output of the temperature detection circuit has a variable current, and the method further includes varying the variable current in accordance with the detected temperature and applying the heating current in accordance with the variable current.

11. A method of driving a magnetic bubble memory device according to claim 7, wherein the output of the temperature detection circuit has a variable drive pulse width, a variable drive pulse period and a variable current, and the method further includes changing two or more of the variable drive pulse width, the variable drive pulse period and the variable current, and applying the heating current in accordance with the changing two or more of the variable drive pulse width, the variable drive pulse period and the variable current.

* * * * *

UNITED STATES PATENT AND TRADEMARK OFFICE
CERTIFICATE OF CORRECTION

PATENT NO. : 4,432,068

DATED : February 14, 1984

INVENTOR(S) : Takai et al.

It is certified that error appears in the above-identified patent and that said Letters Patent is hereby corrected as shown below:

Column 1, line 30, delete "for".
Column 3, line 33, delete "the";
         line 34, after "by" insert --the--;
         line 53, "margin" should be --margins--.
Column 4, line 31, "show the graphs explaining" should be --indicate--;
         line 32, after "of" insert --a--.

Signed and Sealed this

Tenth Day of July 1984

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,432,068
DATED : February 14, 1984
INVENTOR(S) : Takai et al.

It is certified that error appears in the above-identified patent and that said Letters Patent is hereby corrected as shown below:

Column 1, line 30, delete "for".
Column 3, line 33, delete "the"; (first occurrence)
　　　　　line 34, after "by" insert --the--;
　　　　　line 53, "margin" should be --margins--.
Column 4, line 31, "show the graphs explaining" should be
　　　　　--indicate--;
　　　　　line 32, after "of" insert --a--.

This certificate supersedes certificate of correction issued July 10, 1984.

Signed and Sealed this

Fifth Day of November 1985

[SEAL]

Attest:

Attesting Officer

DONALD J. QUIGG

Commissioner of Patents and Trademarks